(12) United States Patent
Matsubara

(10) Patent No.: US 7,538,428 B2
(45) Date of Patent: May 26, 2009

(54) SEMICONDUCTOR DEVICE

(75) Inventor: Yoshihisa Matsubara, Ibaraki (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 0 days.

(21) Appl. No.: 11/590,847

(22) Filed: Nov. 1, 2006

(65) Prior Publication Data
US 2007/0096310 A1     May 3, 2007

(30) Foreign Application Priority Data
Nov. 2, 2005     (JP)     ............... 2005-319433

(51) Int. Cl.
*H01L 23/48*     (2006.01)
(52) U.S. Cl. .................. 257/734; 257/750; 257/758; 257/773
(58) Field of Classification Search .............. 257/734, 257/750, 758, 759, 765, 771, 773, 775, 776, 257/E23.011, E23.012
See application file for complete search history.

(56) References Cited

U.S. PATENT DOCUMENTS 5,289,036 A * 2/1994 Nishimoto ................. 257/774
5,581,109 A * 12/1996 Hayashi et al. ............. 257/503
5,923,072 A * 7/1999 Wada et al. ................. 257/473

OTHER PUBLICATIONS

Advanced Process Technology 2003, Backend Process: Section 5. 200nm pitch double layer Cu interconnection TEG and module results, URL: "http://www.selete.co.jp/SeleteHPJ1/j_ht ml/research/re0022.html", search date is Feb. 1, 2005.

* cited by examiner

*Primary Examiner*—N Drew Richards
*Assistant Examiner*—Paul E Patton
(74) *Attorney, Agent, or Firm*—McGinn IP Law Group, PLLC

(57) ABSTRACT

A semiconductor device having macro circuit including concentrated fine interconnections and extension wiring for connecting the macro circuit and the outer circuit. The widths of the fine interconnections are less than 0.1 μm. An end of the extension wiring is connected to at least two of fine interconnections of the macro circuit arranged in parallel. By this configuration, the possibility of disconnection at the portion where the end of the extension wiring and the fine interconnections are connected is suppressed.

7 Claims, 18 Drawing Sheets

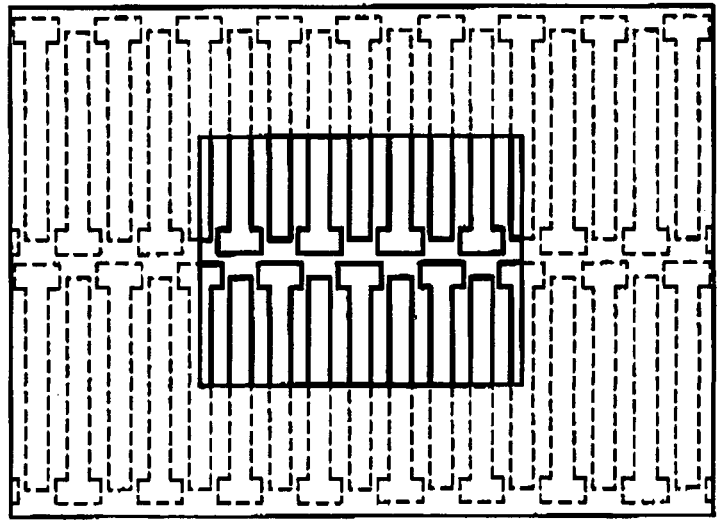
Fig. 12C  LEVEL 2
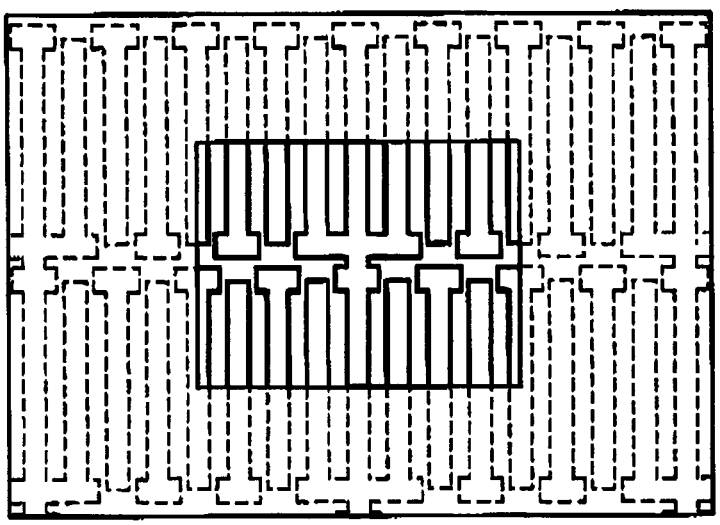
Fig. 12B  LEVEL 1
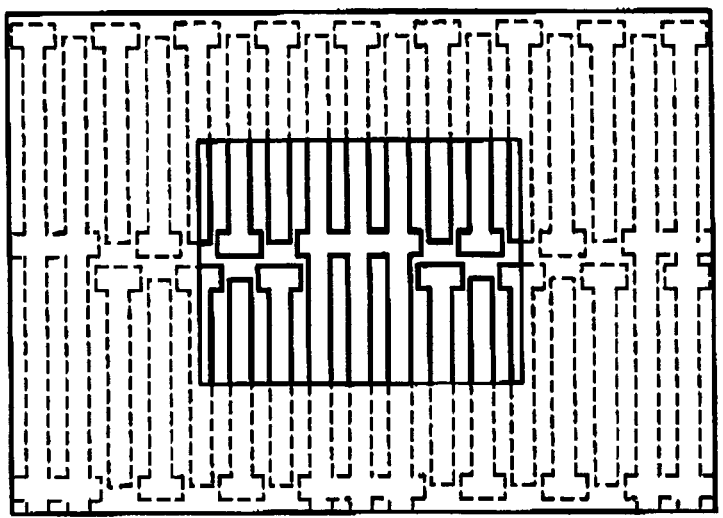
Fig. 12A  REFERENCE EXAMPLE

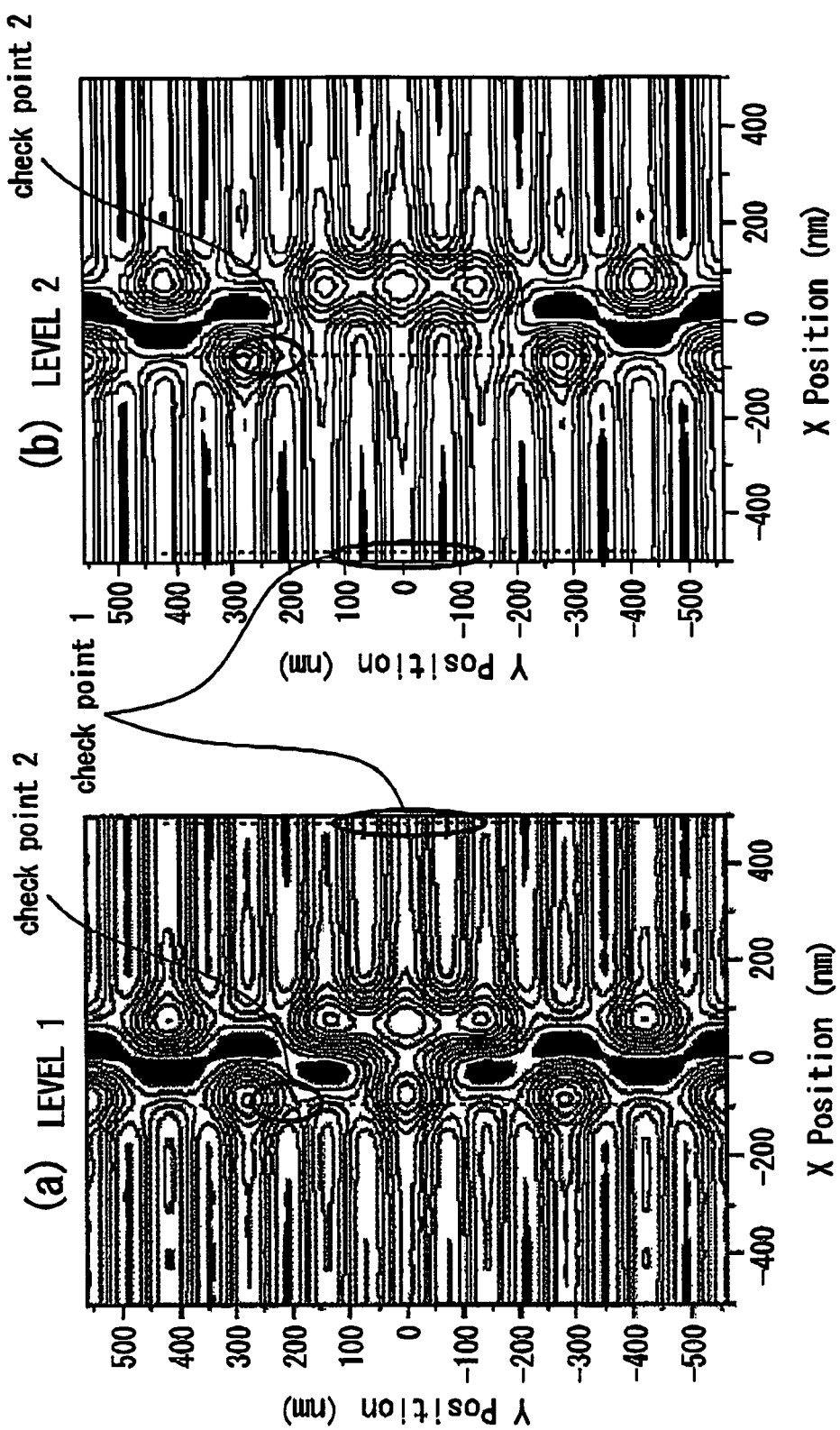

Fig. 17
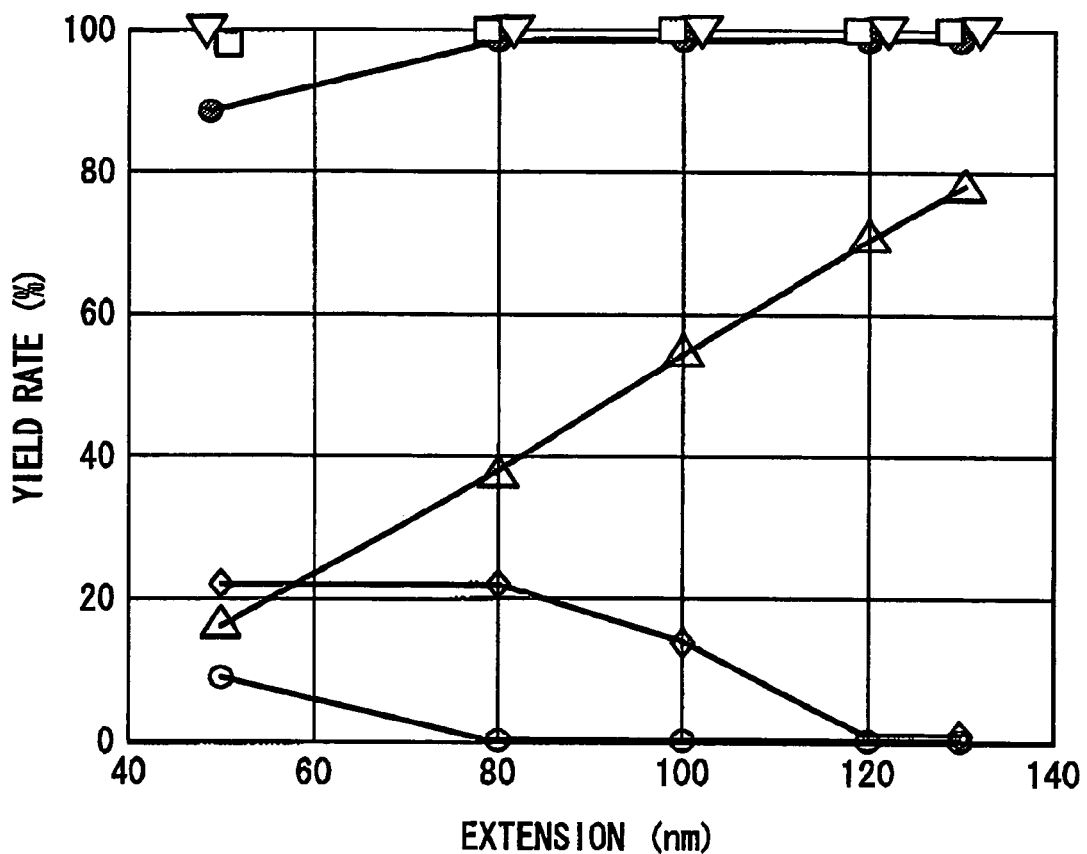
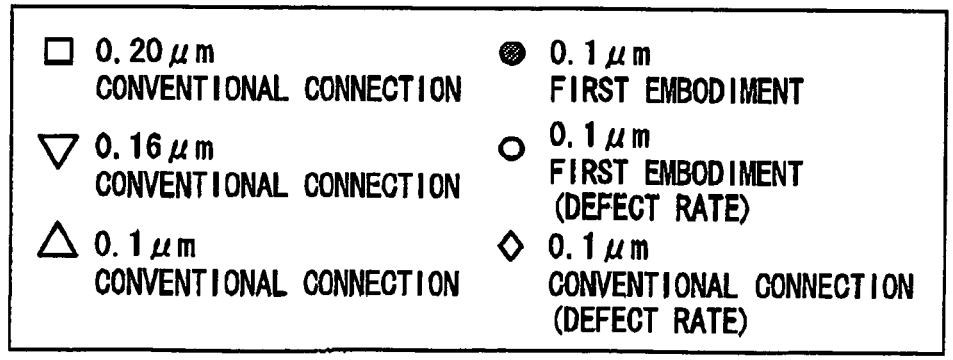

SEMICONDUCTOR DEVICE

BACKGROUND OF THE INVENTION

1. Field of the Invention

The present invention relates to a semiconductor device, and more specifically relates to the connection portion where a macro circuit is connected to an outer extension wiring.

2. Description of the Related Art

A conventional technique of the extension wiring connected to a macro circuit will be described below by exemplifying a test pattern for a process evaluation in a typical semiconductor device. FIG. 1 shows a plan view of an example of the layout of a test chip for a process evaluation. Typically, the maximum value of a lateral width 801 and a longitudinal width 802 of a test chip size is defined in the field size of a lithography apparatus. The evaluation pattern consists of a set of evaluation blocks referred to as sub chips 803, and the sizes of the sub chips 803 are equally configured inside test blocks (refer to "Advanced Process Technology 2003, Backend Process: Section 5. 200 nm pitch double layer Cu interconnection TEG and module results", URL: "http://www.selete.co.jp/SeleteHPJ1/j_html/research/re 0022.html", search date is Feb. 1, 2005). The reason is that since the arrangements and movements of measuring probes is set to be equal in a measuring program, the programs and the measuring probes can be shared. Next, the schema of the pattern for an interconnection process evaluation is explained with reference to FIG. 2. The pattern for the interconnection process evaluation includes a via chain, an electro migration evaluation pattern, a leak measurement pattern and the like. In the via chain, the pattern scale is generally changed on the basis of the length of the interconnection to be evaluated and the number of the via holes. By changing the pattern scale, it is also possible to evaluate the defect density. The evaluation block required to evaluate the process is referred to as a TEG (Test Element Group) region 901, an electrode with which an electrically measuring probe is brought into contact is referred to as an electrode pad 902, and an interconnection through which the TEG region 901 and the electrode pad 902 are connected is referred to as an extension wiring 903.

FIG. 3 shows an enlarged view of an example of the connection region between the TEG region and the electrode pad. As shown in FIG. 3, a via chain pattern 1001 in the TEG region and the electrode pad (not shown) are electrically connected through an extension wiring 1002.

FIG. 4 shows an enlarged plan view of the connection portion to the via chain portion of the extension wiring shown in FIG. 3. As shown in FIG. 4, the width of the interconnection 1102 connected to a via chain portion 1101 is same to the width of the via chain portion 1101 from a region entering the via chain.

FIG. 5 shows an enlarged plan view of the interconnection to a specified pad interconnection. For example, as shown in FIG. 5, the test pattern is provided with a via chain evaluation TEG region 1201 and an extension wiring 1202 for establishing the electric connection to a pad (not shown). The TEG region 1201 has a two-layer interconnection structure where M1 interconnections (belonging to first layer interconnections) 1204 and M2 interconnections (belonging to second layer interconnections) 1203 are alternately arranged. The M1 interconnection and the M2 interconnection are connected through a via 1205. Here, both widths of the M1 interconnection 1204 and the M2 interconnection 1203 are 70 nm that is a minimum interconnection width 1206. In an isolated interconnection portion (an extension wiring 1202) extended from the TEG region 1201 to outside, the interconnection width is stepwise large, and an interconnection width 1207 of the wide portion is about 0.17 µm. A connecting distance 1208 between the wide interconnection portion and the TEG region 1201 is represented in FIG. 5.

FIG. 6 shows a sectional view of the test pattern shown in FIG. 5. As shown in FIG. 6, an insulating film 1304 is formed over a silicon substrate 1303, the M1 interconnections 1204 and the M2 interconnections 1203 are alternately arranged in this region, and those interconnections are connected through the via 1205. Here, both widths of the M1 interconnection 1204 and the M2 interconnection 1203 are 70 nm that is the minimum interconnection width. A margin at the end portions of the M1 interconnection 1204 and the via interconnection 1205 is referred to as an extension 1308.

Next, a process for forming the typical two-layer interconnection is explained. FIGS. 7A to 7E are sectional views of major steps.

At first, a CVD method and the like are applied to form an first interlayer insulating film 1402, which is made of silicon oxide film and the like, on a silicon film 1401 (FIG. 7A). After that, a first photolithography resist 1403 is formed on the first interlayer insulating film 1402, and the resist is patterned by applying a first photolithography method (FIG. 7B). Moreover, after this resist pattern is printed on the first interlayer insulating film 1402 by applying a dry etching technique, the resist 1403 is removed, thereby forming an interconnection trench 1404 at appropriate positions (FIG. 7C).

Next, the CVD method and the like are applied to form a conductive film 1405 made of copper, aluminum and the like on the whole surface of the first interlayer insulating film 1402 including the interconnection trench 1404 (FIG. 7D). Or the barrier metal layer is formed through sputtering method and copper plating is applied so that the level difference on the surface is covered and flattened. Then, CMP is applied for etching back to flatten the surface of the conductive film 1405. As a result, a first interconnection 1406 of a damascene interconnection structure is formed at a desirable position of the first interlayer insulating film 1402 (FIG. 7E).

After forming the M1 layer interconnections by the process described above, the process including the steps similar to the steps shown in FIGS. 7A to 7E is applied to the upper surface of the M1 layer including the forming of a via mask and a M2 mask so that the double-layer interconnection device is manufactured.

The conventional technique in a typical CPU logic circuit will be described below. The structure of an interconnection to an electrically integrated circuit block from an isolate circuit block is described by exemplifying this conventional example, because the similar structure is used not only in the TEG extension wiring for the process evaluation but also in products.

The product is provided with four macro functions of an I/O block, a RAM unit, a logic unit and PLL. The schematic structure is shown in FIG. 8.

In FIG. 8, an I/O block 1501 is an area in which the widths of the interconnections are 1 µm or more. Basically, there is no need of narrower interconnection in this area. The allowable capacity limit on a large current is determined by this area, and the maximum values of the interconnection width and the via diameter are determined by this area. As for an I/O input, typically, there are one output and one input interconnection for a pad block.

The typical memory size of the RAM block 1502 is about 1 megabyte. In this area, priority is given to the fineness of the structure over the high-speed of the interconnections so that the need of the narrow interconnections is high. The wide interconnection is relatively little, and power sources and GND interconnections are periodically aligned at a unit of a memory cell size.

A high performance logic block 1503 is a cell that requires a drive performance, and block where a power source interconnection is enhanced. Basically, the structure of this block is close to the standard cell configuration of the gate array. Although the configuration of the interconnection is similar to that of the RAM, the power source interconnection is typically enhanced over the RAM. As compared with the PLL, typically, there are a plurality of connections connecting between the macro circuits.

In a PLL block 1504, priority is given to the stability of the operation of the power source, GND and capacitive elements. Thus, although the interconnection density is smaller, typically, the interconnection width is wide next to the I/O region. The PLL amplifies a signal input from an external transmitter by 4 times or 5 times or the like and generates a clock tree for each macro. This clock input unit and clock output unit serve as the extension wiring from the macro circuit. Basically, there are only two input/output interconnections.

In this typical interconnection arrangement structure, the block connection structure of two logic unit macro circuits are explained with reference to FIG. 9.

In FIG. 9, a logic region (macro circuit region) 1601, a second logic region (macro circuit region) 1602, and an intermediate region 1603 between the macro circuits are shown. A power source mesh 1604 and a GND mesh 1605 are arranged in the macro. A wire interconnection and a signal interconnection 1606, which serve as circuit configuration elements, are arranged between the power source mesh 1604 and the GND mesh 1605 in the macro. Moreover, signal interconnections for connecting the macros are shown. A connection region 1607 between those signal interconnections are drawn in FIG. 9. There is a case that the interconnections between the macros are connected through the same interconnection layer, or there is a case that they are connected through different interconnection layers.

As mentioned above, in the conventional CPU logic circuit, the interconnection having minimum width or constant width is extended from a macro circuit to outside and connected to the circuit outside the macro.

SUMMARY OF THE INVENTION

In the conventional technique as shown in FIG. 5, in the structure in which the extension are extended from the macro circuit to the outside within a same layer, the predetermined fine interconnection is extended from the macro circuit, in which the plurality of fine interconnections of 0.1 μm or less are integrated, to the outside, the fine interconnection is connected to the wider extension wiring, in the region outside the macro circuit. In the conventional structure, the fine interconnection is isolated in the region (the region 1208 shown in FIG. 5) between the wide extension wiring and the macro circuit region.

Relating to the above-explained structure, the inventor of the present invention has taken particular note on the following characteristics, which can be potential problem in manufacturing the semiconductor devices.

In the conventional example, the problem of disconnection may occur in the fine isolated interconnection portion extended from the macro circuit to the outside within a same interconnection layer. The disconnection is caused by the unevenness in the resolution power of exposure associated with the density difference of the interconnections between the region where the interconnections are sparsely arranged and where they are densely arranged. In other words, this is the problem that the compensation is greatly changed in response to the difference of the exposure magnitude. For this reason, in the resist pattern printed on a wafer, there was a problem that the interconnection may be disconnected because of the underexposure in the region between the macro circuit region and the wide extension wiring linked to the fine interconnection in the macro circuit in the region out of the macro circuit.

It is therefore an object of the present invention to provide a semiconductor device having a structure that can suppress the possibility of disconnection in the region between the macro circuit, in which the plurality of fine interconnections of 0.1 μm or less are integrated, and the wide extension wiring portion linked to the fine interconnections of this macro circuit.

According to an aspect of the present invention, a semiconductor device includes: a macro circuit including fine interconnections; and an extension interconnection which is wider than the fine interconnections and has a first end connected to at least two of the fine interconnections and a second end located at an outside of the macro circuit.

In this configuration, the sharp change in the exposure intensity around the region where the minimum width interconnections in the macro circuit and the wide extension wiring are connected can be suppressed. As a result, the disconnection of the minimum width interconnection in the macro circuit near the first end of the extension interconnection can be suppressed.

BRIEF DESCRIPTION OF THE DRAWINGS

FIGS. 12A to 12C are simulation results in the case of the layout view in the second embodiment;

FIG. 13A shows the plan topographies of the light intensity;

FIG. 17 is a graph for comparing the defect generation frequencies of the first embodiment and that of a conventional technique.

DESCRIPTION OF THE PREFERRED EMBODIMENTS

The embodiment of the present invention will be described below with reference to the drawings.

First Embodiment

As the first embodiment of the present invention, an example of a TEG for a process evaluation is listed.

Figure 1:
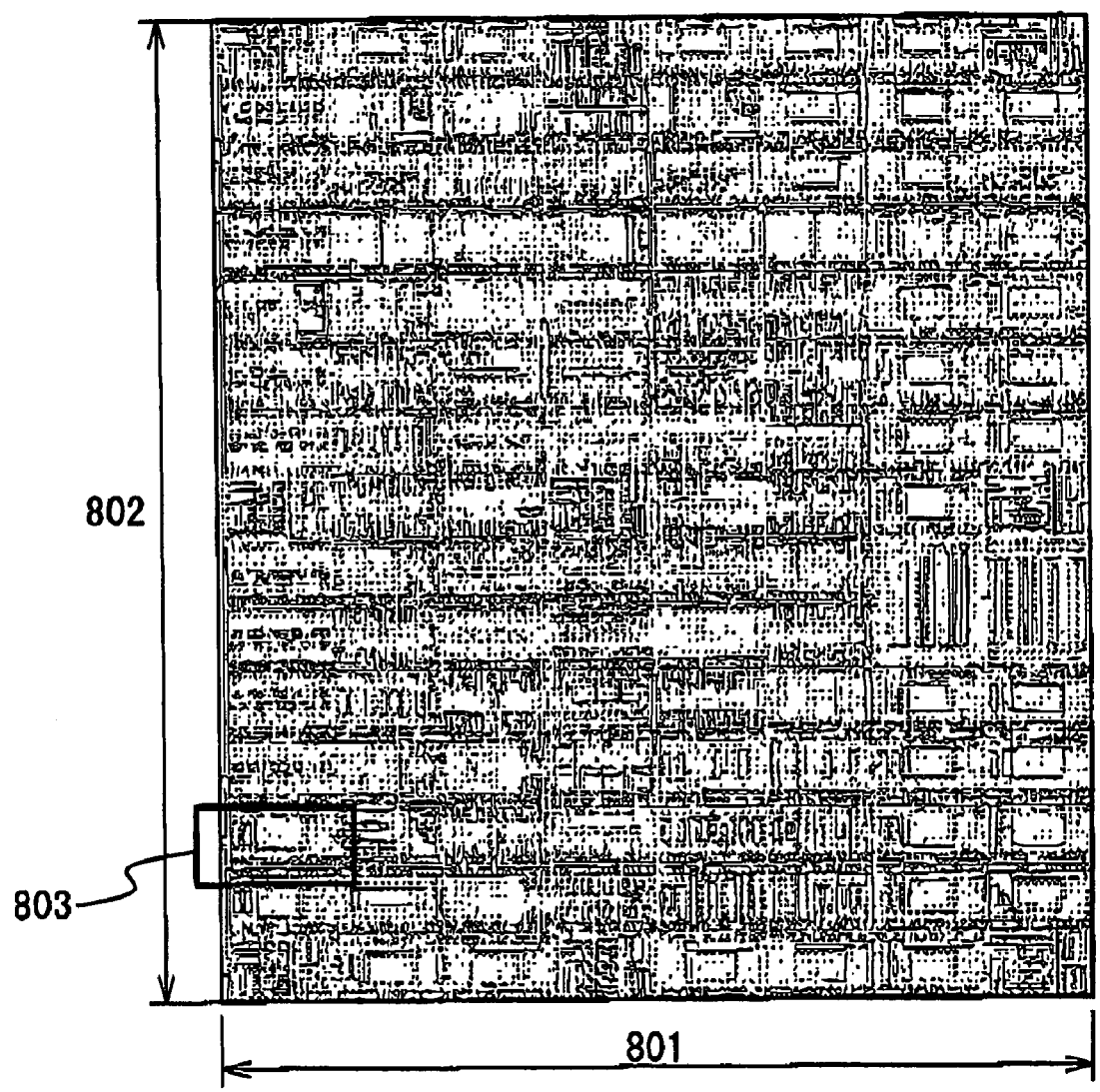
FIG. 1 is the entire view of a test chip layout for a typical process evaluation.
Figure 2:
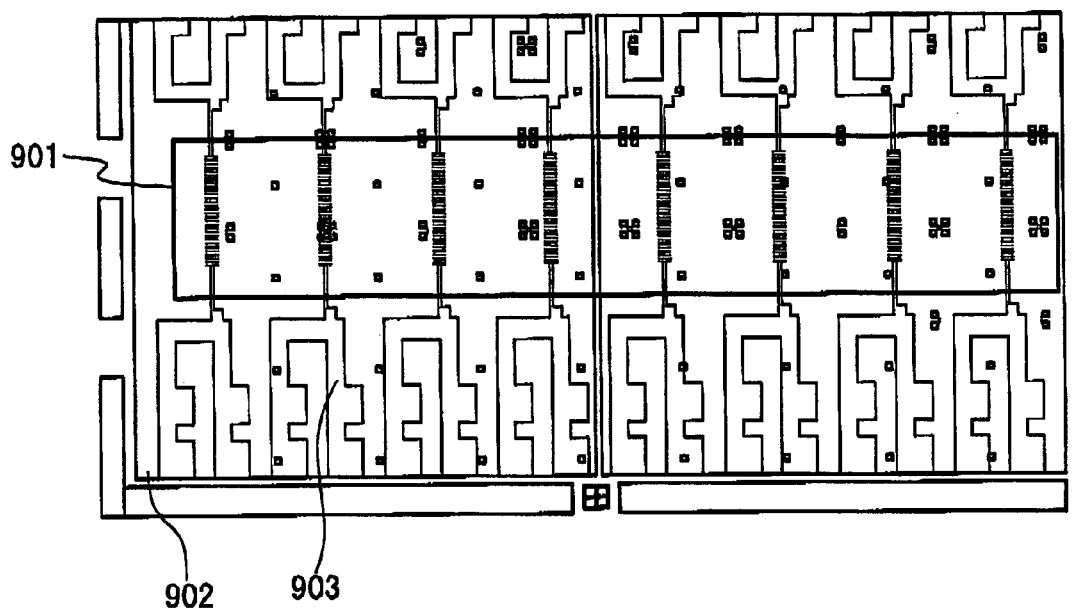
FIG. 2 is the enlarged plan view showing a pattern for a typical interconnection process evaluation.
Figure 3:
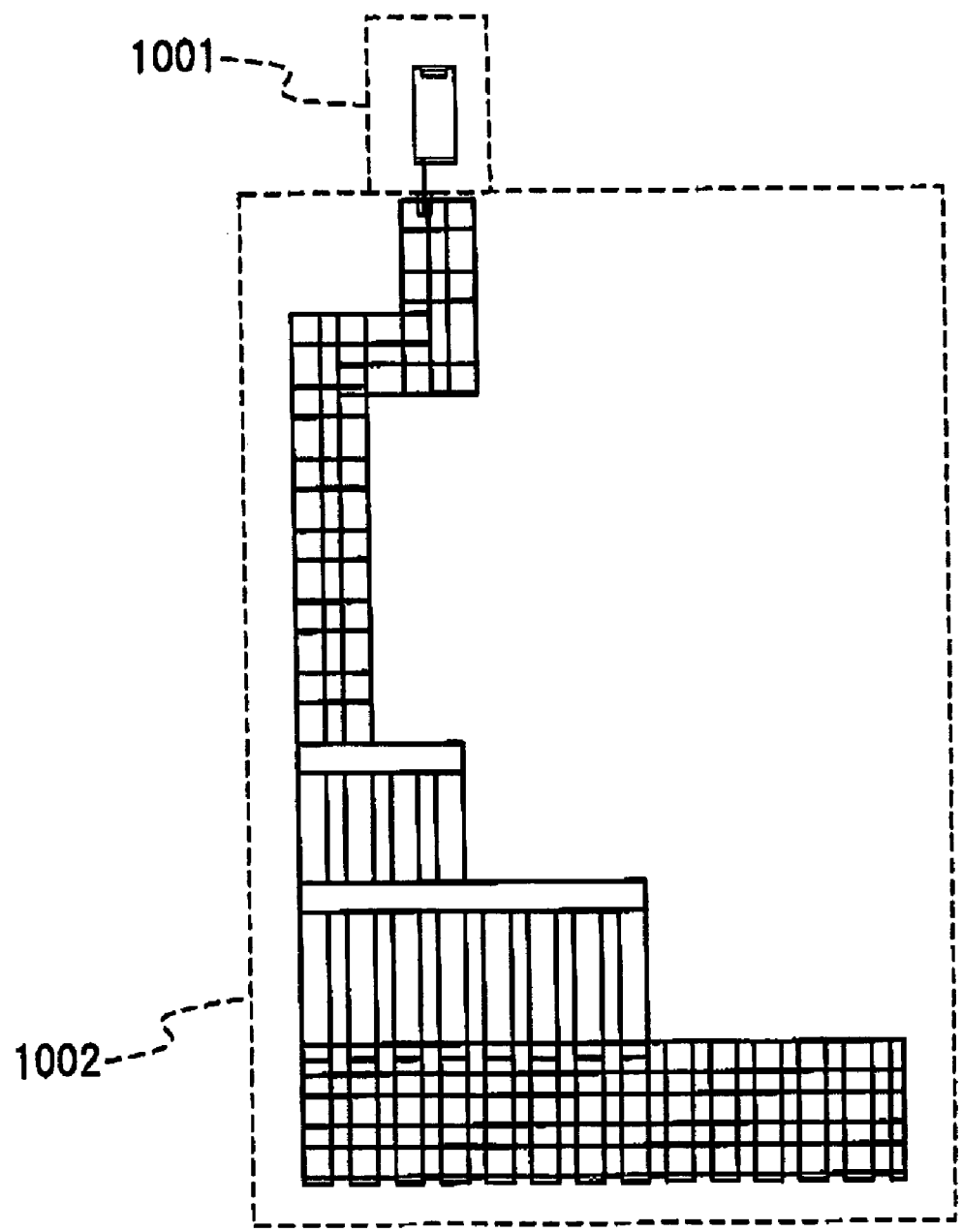
FIG. 3 is the enlarged plan view of a connection region between a TEG region and an electrode pad.
Figure 4:
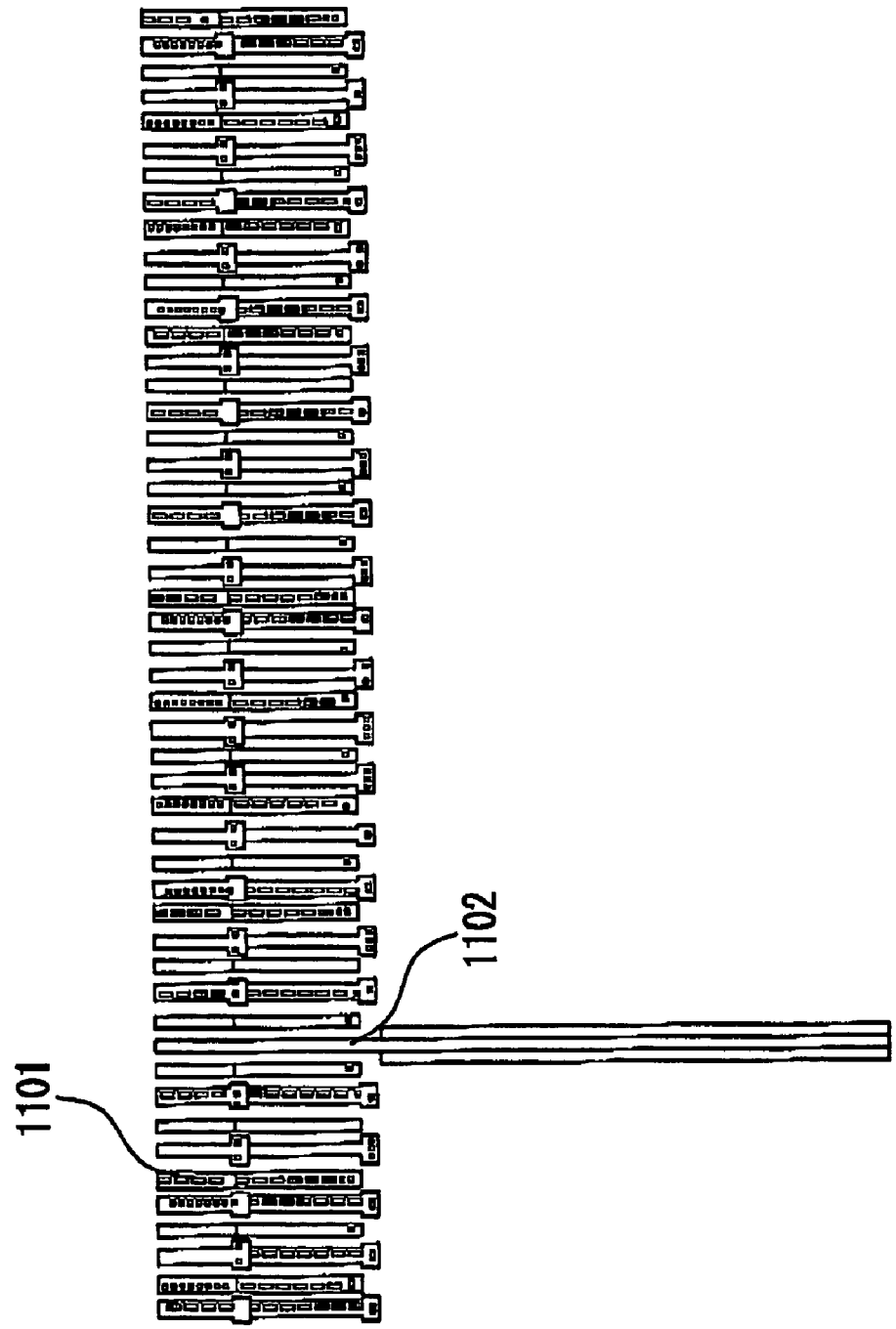
FIG. 4 is the enlarged plan view showing a connection portion between an extension wiring and a via chain pattern in FIG. 3.
Figure 5:
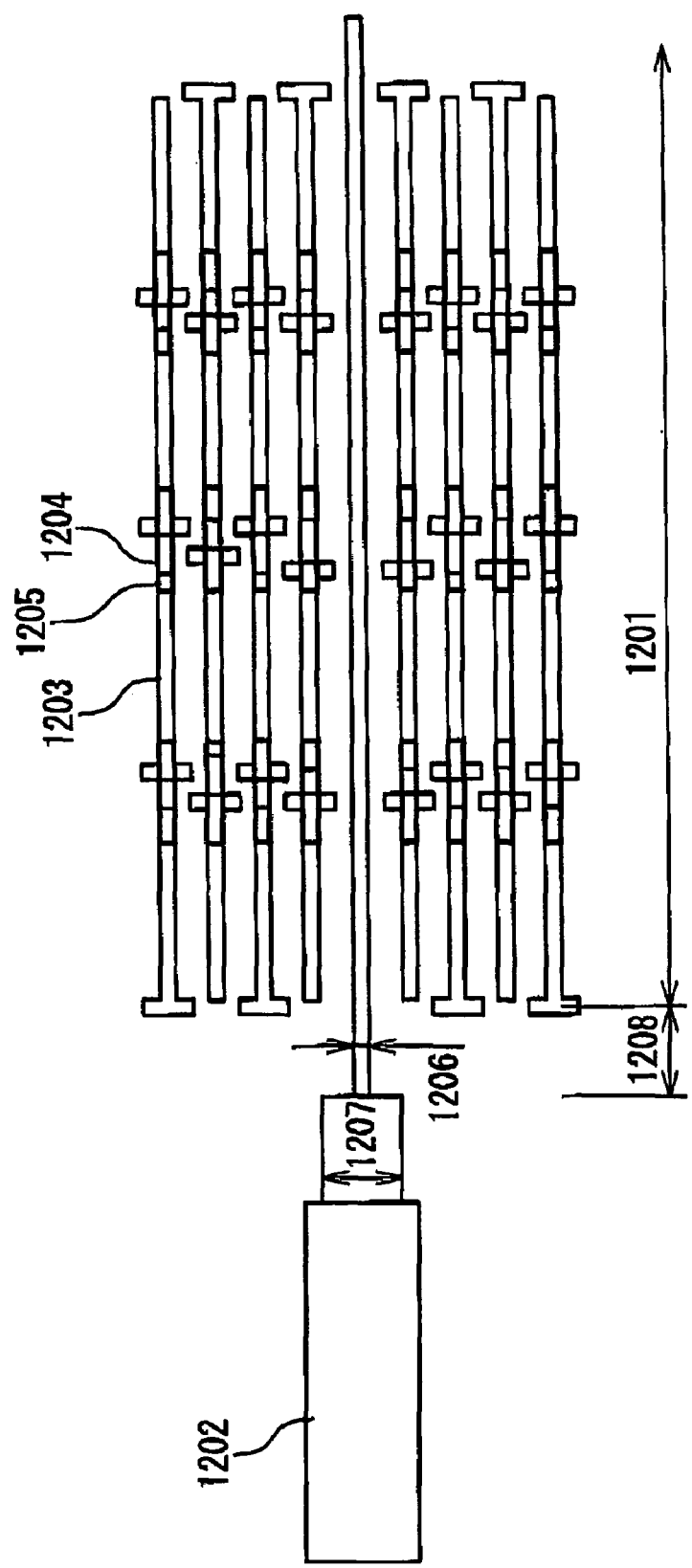
FIG. 5 is the enlarged plan view of a connection interconnection to a specified pad wring.
Figure 6:
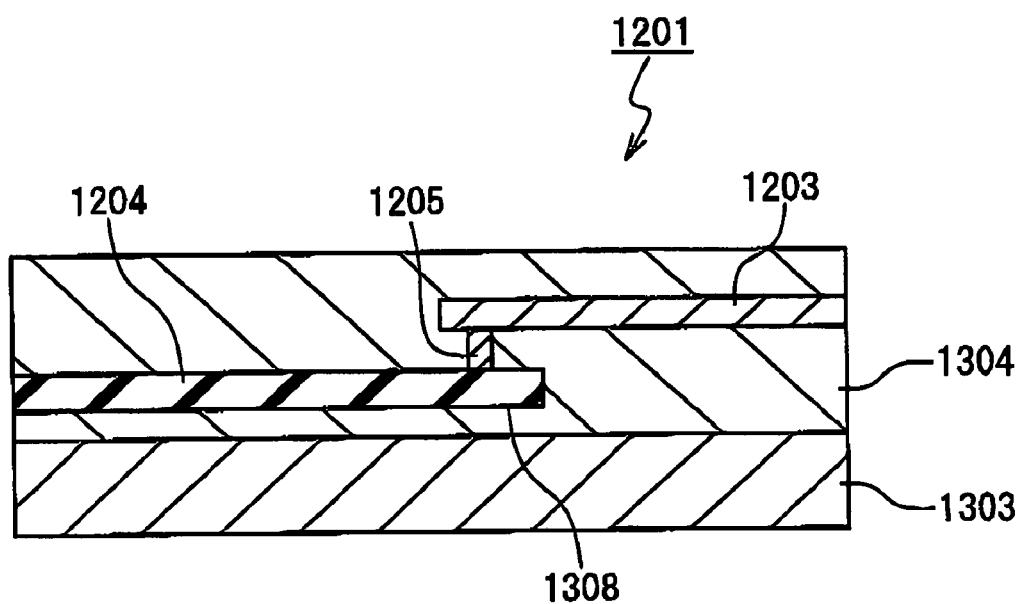
FIG. 6 is the sectional view of a conventional interconnection structure shown in FIG. 5.
Figure 7A:
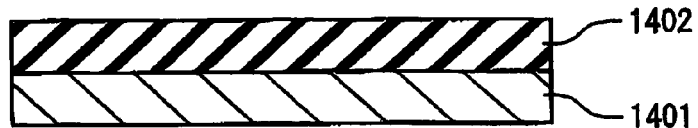
FIGS. 7A to 7E are the sectional views describing the respective steps of the process for manufacturing a typical two-layer interconnection.
Figure 7B:
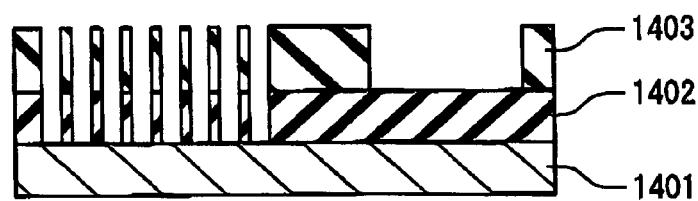
Figure 7C:
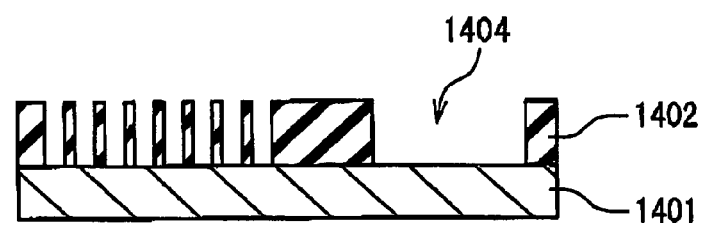
Figure 7D:
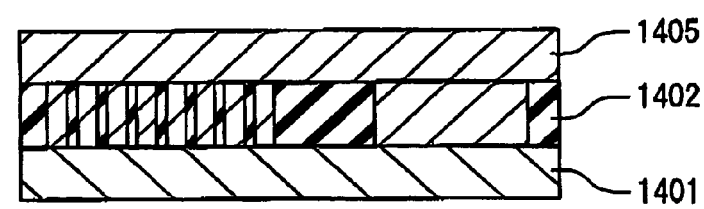
Figure 7E:
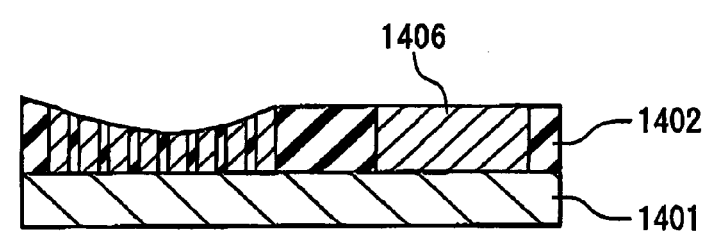
Figure 8:
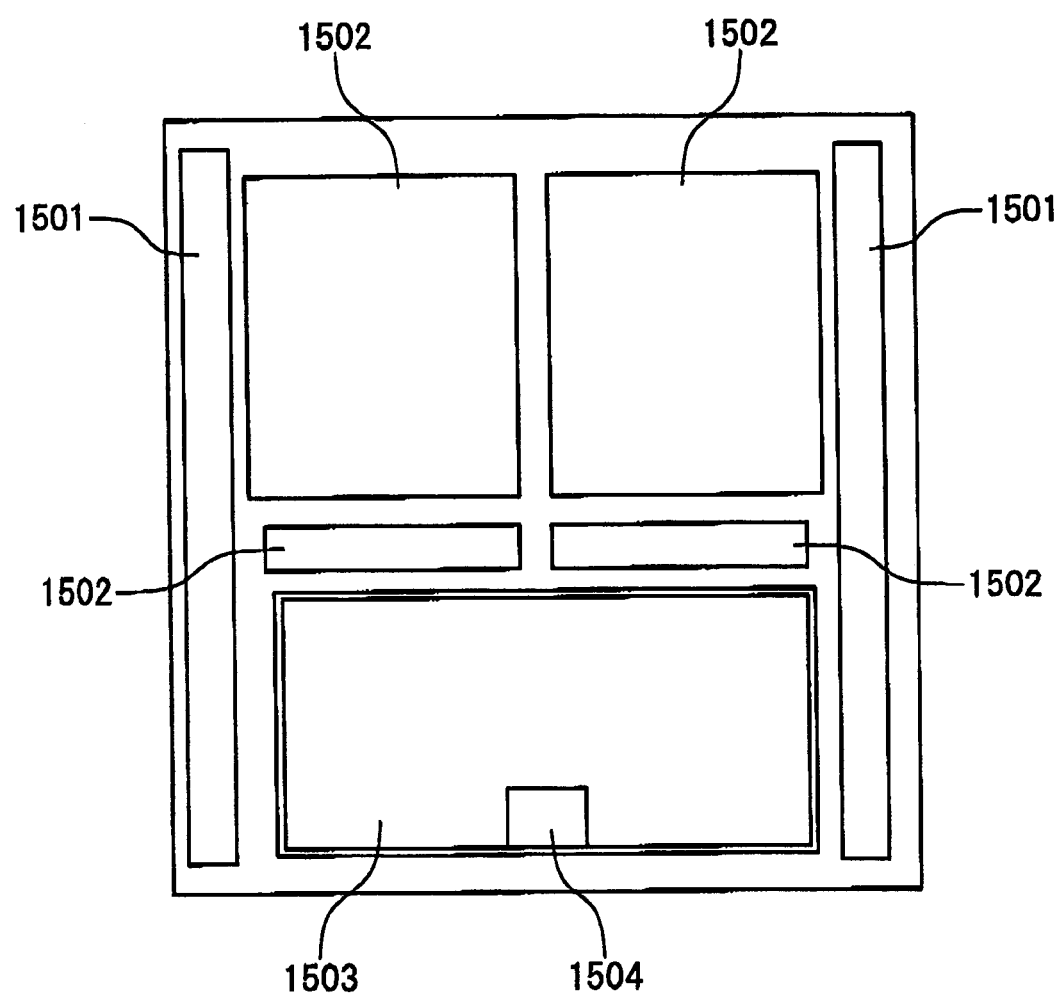
FIG. 8 is the plan view showing a schema of a typical product.
Figure 9:
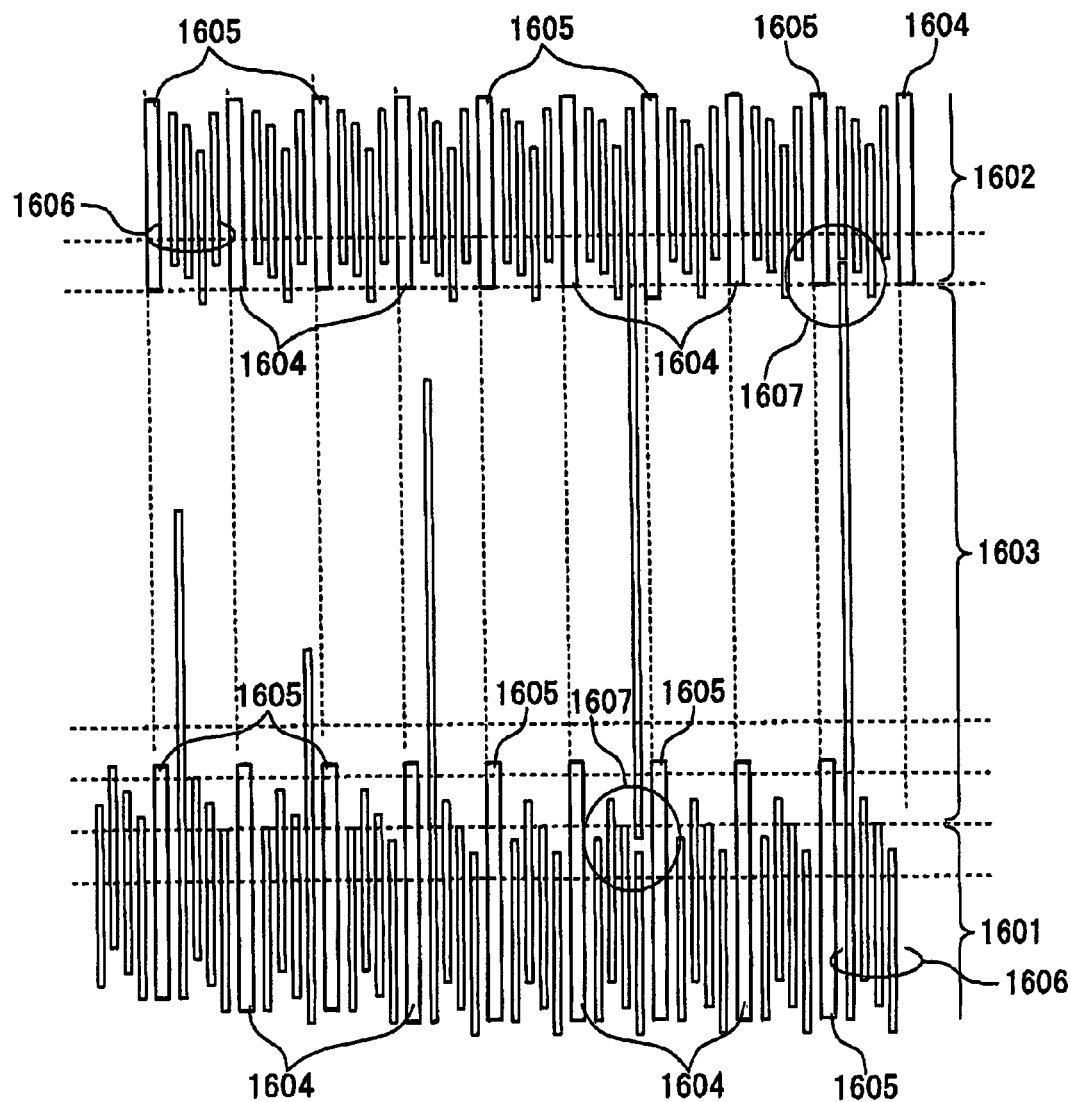
FIG. 9 is the plan view showing a connection structure between two macro blocks.
Figure 10:
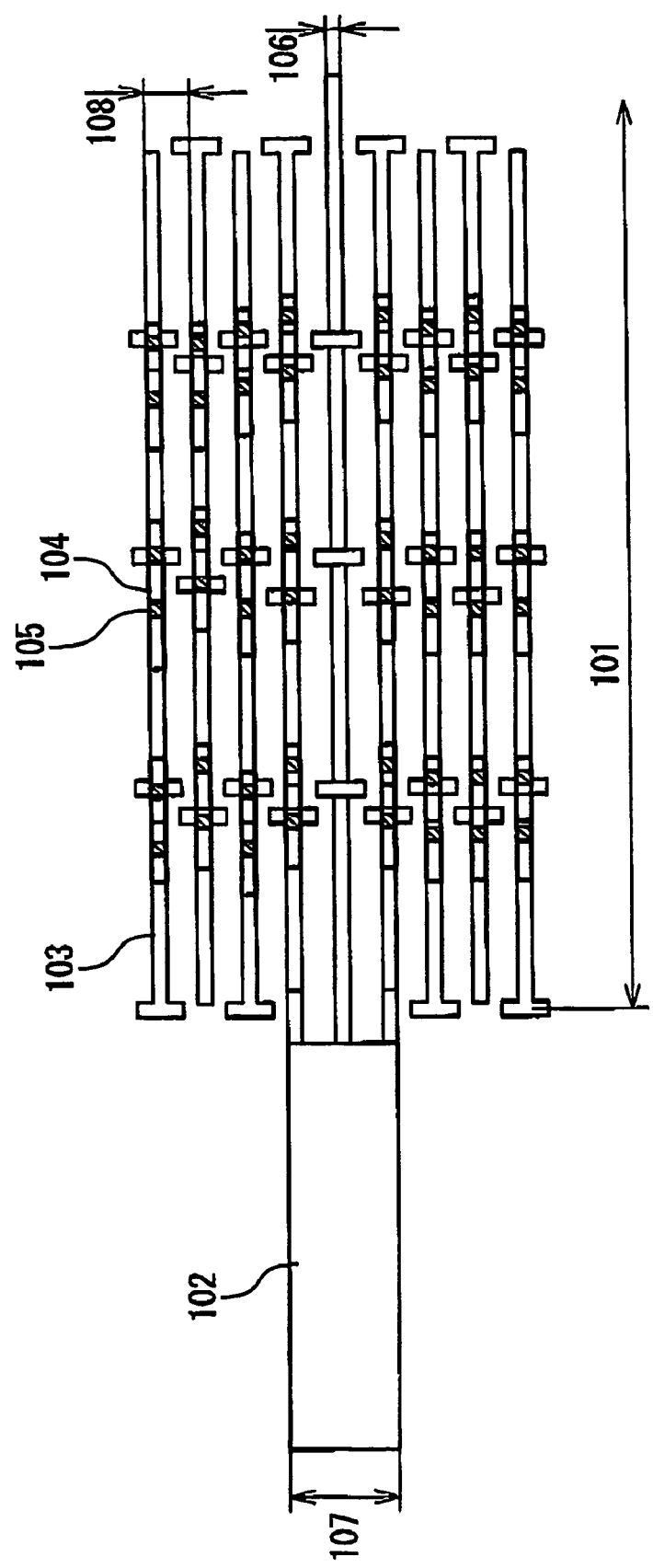
FIG. 10 is the enlarged plan view of the first embodiment, showing a TEG and parallel interconnections extended from the TEG region to outside.

FIG. 10 shows an enlarged plan view of the first embodiment of the present invention, in which a TEG and interconnections extended from the inside of the TEG region to the outside thereof are shown.

A test pattern is provided with: a via chain evaluation TEG region 101 corresponding to a macro circuit region; and an extension wiring 102 for establishing the electric connection to a pad (not shown). A via chain portion formed in the TEG region 101 is configured such that the M1 interconnections (first layer interconnections) 104 and the M2 interconnections (second layer interconnections) 103 are arranged alternately in upper and lower directions, and those interconnections are connected through vias 105. Here, both widths of the M2 interconnection 104 and the M2 interconnection 103 are 70 nm that is the minimum interconnection width 106. The interconnection width 107 of the extension wiring 102 isolated outside of the TEG region 101 is 0.3 μm. To an end of the extension wiring 102 (called as "first end") located near the TEG region 101, three M2 interconnections 103 are connected in parallel. The other end ("second end") of the extension wiring is connected to a circuit located at the outside of the TEG region. The pitches of the parallel M2 interconnections 103 (namely, the distance between the adjacent interconnections 103) connected to the end of the extension wiring 102 are 140 nm that is the minimum pitch 108 of the via chain.

In this way, this embodiment is characterized in that in a semiconductor device which contains: a macro circuit where a plurality of fine interconnections of 0.1 μm or less are integrated; and an extension wiring which is connected to the predetermined fine interconnection (which is placed located the inside of the macro circuit and extended in the same interconnection layer towards the outside of the macro circuit) and is wider than the fine interconnections, two or more fine interconnections connected to the wide extension wiring are arranged in parallel in the region inside of the macro circuit. Then, the fine interconnections arranged in parallel are equal in width and have the minimum pitch in the macro circuit.

Next, the effect of this embodiment will be explained.

Since the three parallel interconnections having the minimum interconnection width in the macro are connected to the wide extension wiring outside of the macro, there is no isolated portion of the fine interconnections in the connection region between the wide extension wiring and the macro circuit. Consequently, the lack of the light intensity in this region is solved, and the event that the interconnection is formed to be disconnected is prevented.

Second Embodiment

As the second embodiment of the present invention, an example of a TEG for the process evaluation is shown below.

Figure 11:
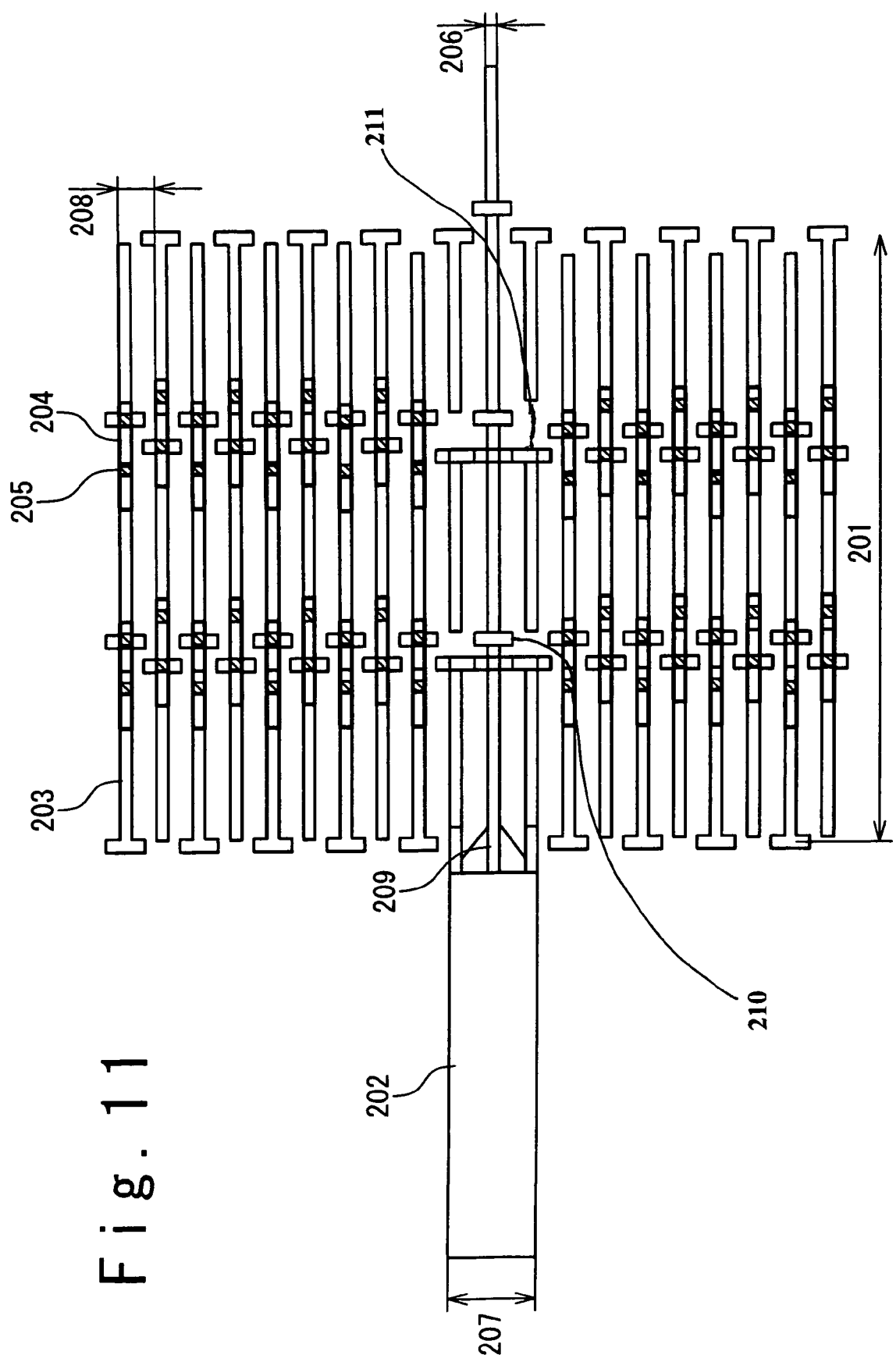
FIG. 11 is the enlarged plan view of the second embodiment, showing a TEG and parallel interconnections extended from the TEG region to outside.

FIG. 11 shows an enlarged plan view of TEG and interconnections extended from the inside of the TEG region to the outside thereof, as the second embodiment.

A test pattern is provided with: a via chain evaluation TEG region 201 corresponding to a macro circuit region; and an extension wiring 202 for establishing the electric connection to a pad (not shown). A via chain portion formed in the TEG region 201 is configured such that M1 interconnections 204 and M2 interconnections 203 are arranged alternately in upper and lower directions, and those interconnections are connected through vias 205. Here, both the widths of the M1 interconnection 204 and the M2 interconnection 203 are 70 nm that is the minimum interconnection width 206. The interconnection width 207 of the extension wiring 202 isolated outside the TEG region 201 is 0.3 μm. At the end of the side of the TEG region 201 of the extension wiring 202, three M2 interconnections 203 are connected in parallel. Pitches of the parallel M2 interconnections 203 connected to the end of the extension wiring 202 are 140 nm that is the minimum pitch 208 of the via chain.

In this embodiment, at the connection portion where the three M2 interconnections 203 and the extension wiring 202 are connected, an end 209 of the central M2 interconnection among the three M2 interconnections 203 has a portion having tapered shape, namely, a portion having the shape that its width is obliquely enlarged and gradually wide towards the end of the extension wiring 202.

Also, in the region inside of the macro circuit, the central M2 interconnection has the simple shape of a straight line. On the contrary, the two M2 interconnections on both sides thereof have the shape where the straight line portions are arranged such that intervals are set. Namely, the central M2 interconnection has a normal portion where adjacent M2 interconnections adjacently exist and an isolation portion where the adjacent M2 interconnections do not exist. Thus, the central M2 interconnection has the isolation portion where there is no interconnection on both the sides thereof. Hence, the width of a part of the isolated interconnection portion is made wider (as shown in the widened portion 210 in FIG. 11). This configuration is also applied to the first embodiment as shown in FIG. 10. Moreover, an interconnection 211 so as to link the separated ends of those M2 interconnections on both the sides thereof is formed from the central M2 interconnection.

Next, the effect of this embodiment is described.

The end of the central M2 interconnection among the three M2 interconnections connected to the extension wiring 202 is enlarged obliquely at a predetermined angle towards the extension wiring 202 and made to be tapered shape. Thus, the stable shape is obtained correspondingly to the change in the exposure magnitude.

Also, in the configuration that the isolated interconnection length portion exists in the central M2 interconnection among the three M2 interconnections 203 in the region inside of the macro which are connected to the extension wiring 202, the interconnection width of the part of this isolated interconnection portion is made wider, for avoiding the problem that the isolated interconnection portion is made narrower and disconnected in the process of manufacturing. Moreover, the interconnection 211 so as to link the ends where the M2 interconnections on both the sides thereof are separated is formed from the central M2 interconnection. Thus, the margin for suppressing the short defect of the end where the M2 interconnections on both the sides thereof are separated can also be enlarged.

Figure 13B:
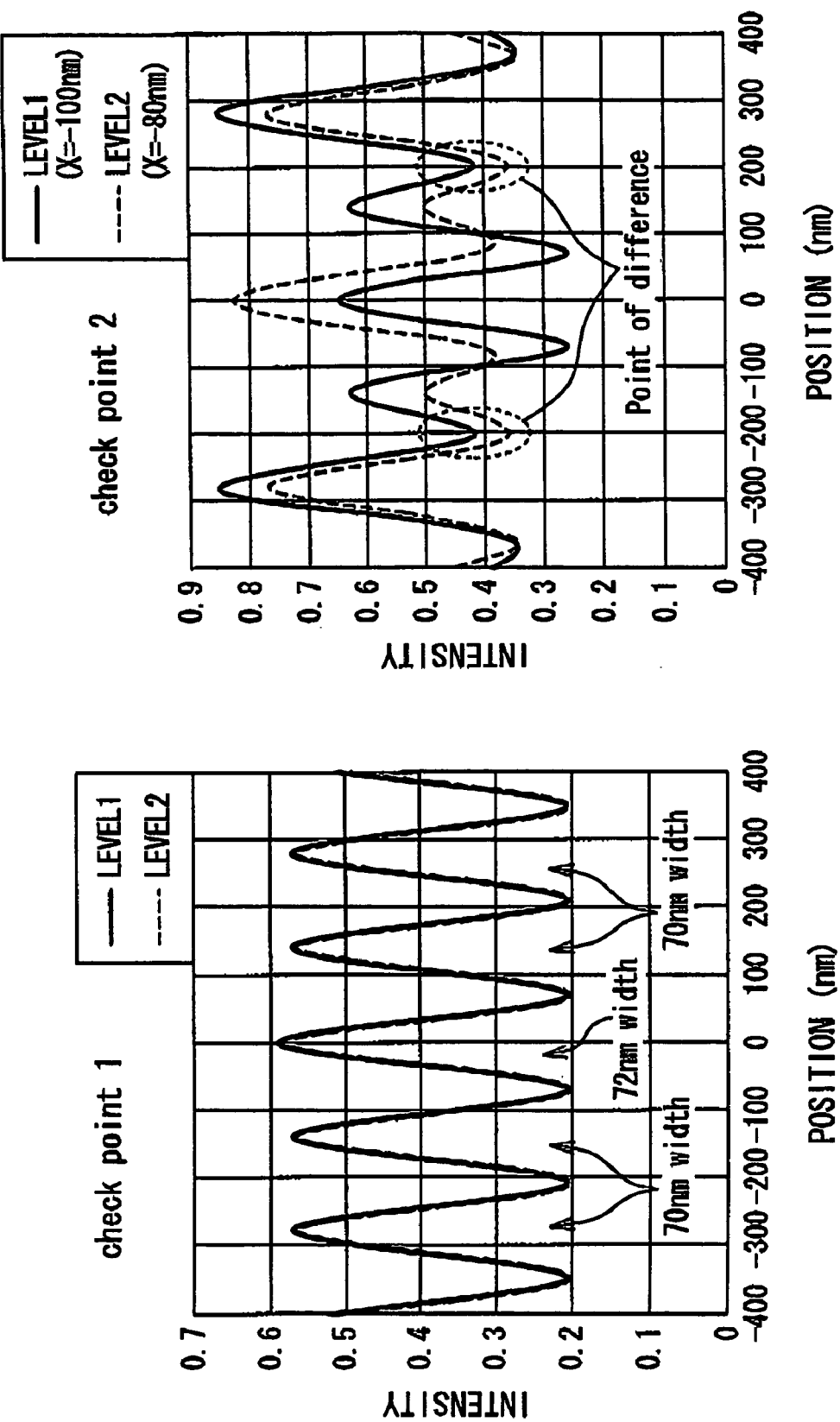
FIG. 13B shows the position dependency of the light intensity of white line regions shown in FIG. 13A.

Here, FIG. 12 shows an example of a simulation result of the connecting method of the interconnections. This embodiment corresponds to the level 1. FIG. 13A shows a pattern dependency of a light contrast. The level 1 is shown to be better because in a separating region, it is lower in light intensity than the level 2. FIG. 13B shows a plotted data of a special image in the white region. The level 1 is better because in the separating region, it is lower in the light intensity than the level 2.

Third Embodiment

As the third embodiment of the present invention, an example of a TEG for a process evaluation is described below.

Figure 14:
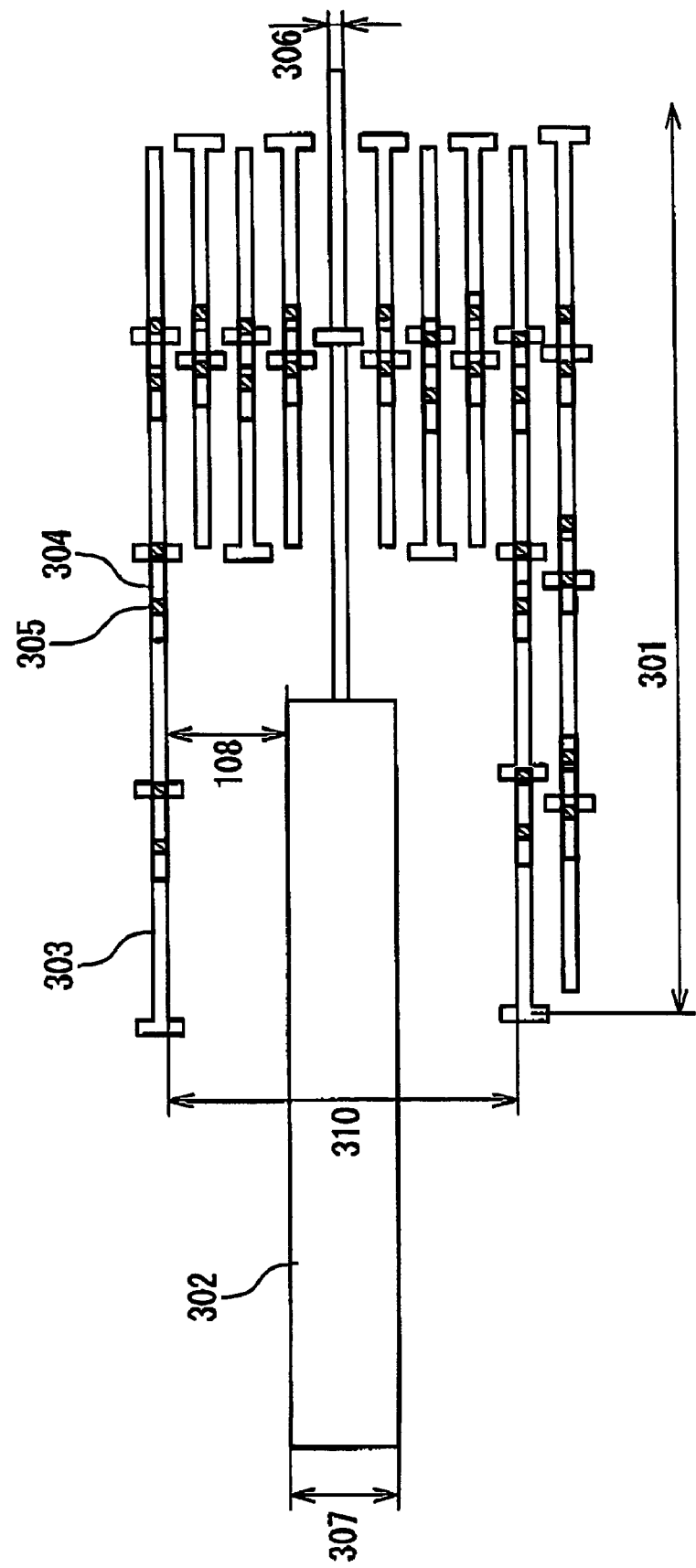
FIG. 14 is the enlarged plan view of the third embodiment, showing a TEG and an interconnection extended from the TEG region to outside.

FIG. 14 shows an enlarged plan view of TEG and an interconnection extended from the inside of the TEG region to the outside thereof, as the third embodiment.

A test pattern is provided with: a via chain evaluation TEG region 301 corresponding to a macro circuit region; and an extension wiring 302 for establishing the electric connection to a pad (not shown). A via chain portion formed in the TEG region 301 is configured such that M1 interconnections 304 and M2 interconnections 303 are arranged in series alternately in upper and lower directions, and those interconnections are connected through vias 305. Here, both widths of the M1 interconnection 304 and the M2 interconnection 303 are 70 nm that is the minimum interconnection width 306. The interconnection width 307 of the extension wiring 302 isolated outside the TEG region 301 is about 0.3 μm. The extension wiring 302 is extended inside of the TEG region 301 and is connected to one of the M2 interconnections 303. The widths of the extension wiring 302 outside and inside of the TEG region are same. The distance 308 between the portion arranged inside of the TEG region 301 of the wide extension wiring 302 and the interconnection arranged around this extension wiring is shown in FIG. 14.

In the other words, the extension wiring 302 is formed to cross the outer envelope 309 of the TEG region. At an edge of the TEG region, a concave portion is formed, where the fine interconnections do not exist and placed at the inside of the outer envelope 309. The first end of the extension wiring 302 is located in the concave portion. The width of the extension wiring 302 in the concave portion is same to the width outside or the envelope 309. At the concave portion, the first end of the extension wiring 302 is connected to an M2 interconnection 303. The second end of the extension wiring 302 is placed outside the envelope 309 of the TEG region and is connected to a circuit located outside of the TEG region.

In this way, this embodiment is an example where the wide extension wiring is formed to be overlapped with the macro region (which is bounded by the above-mentioned envelope and includes the concave portion) and connected to the interconnection in the macro region. In short, this is the example that with the use of the overlap region, the change portion where the exposure magnitude is changed is given to the overlap region.

Next, the effect of this embodiment is described.

Since the extension wiring whose width is wide is overlapped with the macro region and connected to the interconnection in macro, the change in the exposure magnitude around the connection portion between the wide extension wiring and the minimum width interconnection inside of the macro can be suppressed, thereby attaining the effect that the macro interconnection in macro of the minimum interconnection width connected to the wide extension wiring is stably connected.

Fourth Embodiment

Figure 15:
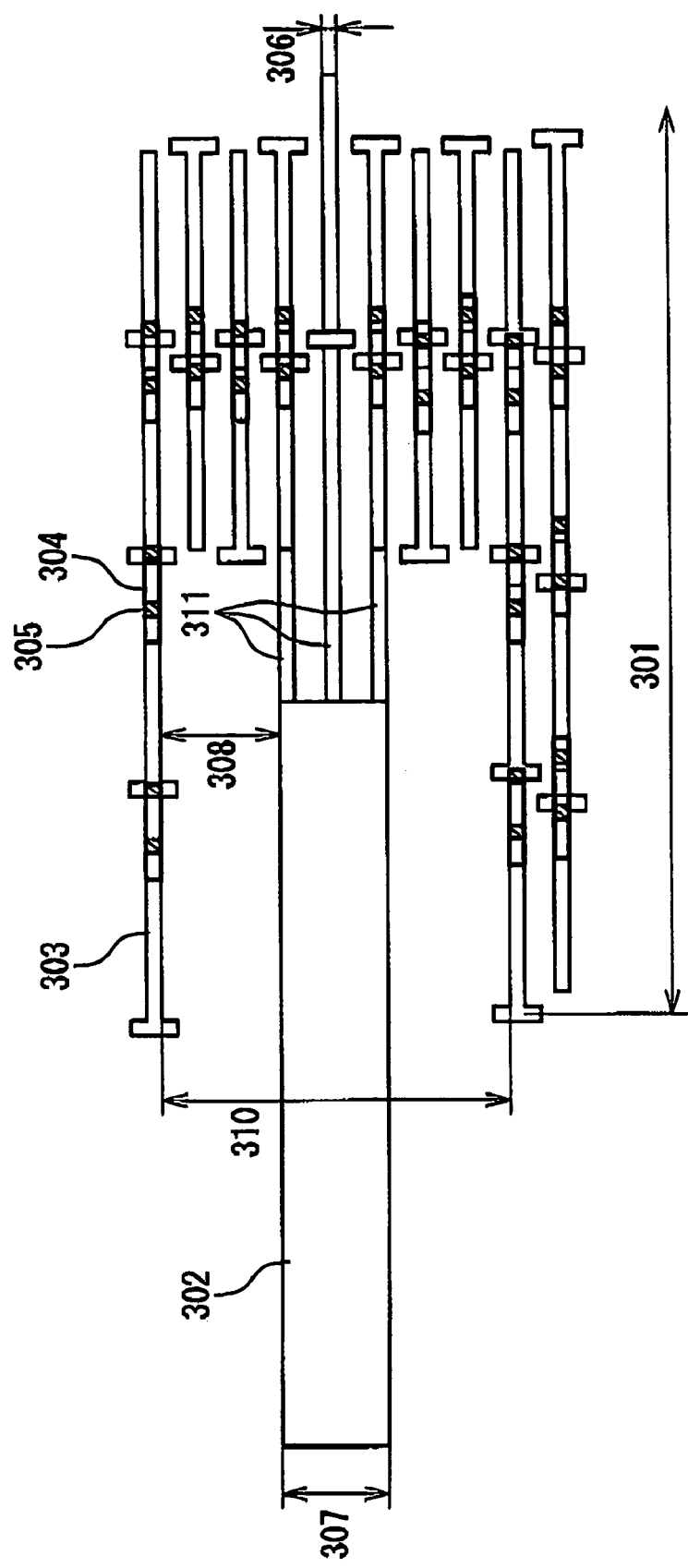
FIG. 15 is the enlarged plan view of the fourth embodiment, showing a TEG and an interconnection extended from the TEG region to outside.

FIG. 15 shows an enlarged plan view of a TEG and interconnections extended from the inside of the TFG region to the outside thereof, as the fourth embodiment.

In this embodiment, the TFG region has a concave portion similar to that of the third embodiment. The extension wiring 302 is also similar to that of the third embodiment and its first end wiring 302 is placed in the concave portion.

However in this embodiment, the first end of the extension wiring 302 is connected to the plurality of M2 interconnections 303 like the first end of the first embodiment. The extension wiring 302 and the M2 interconnections 303 are placed within the same layer. Also in this embodiment, the extreme change in the exposure magnitude around the connection portion can be suppressed, and the wide extension and the fine interconnections can be stably connected.

Fifth Embodiment

Figure 16:
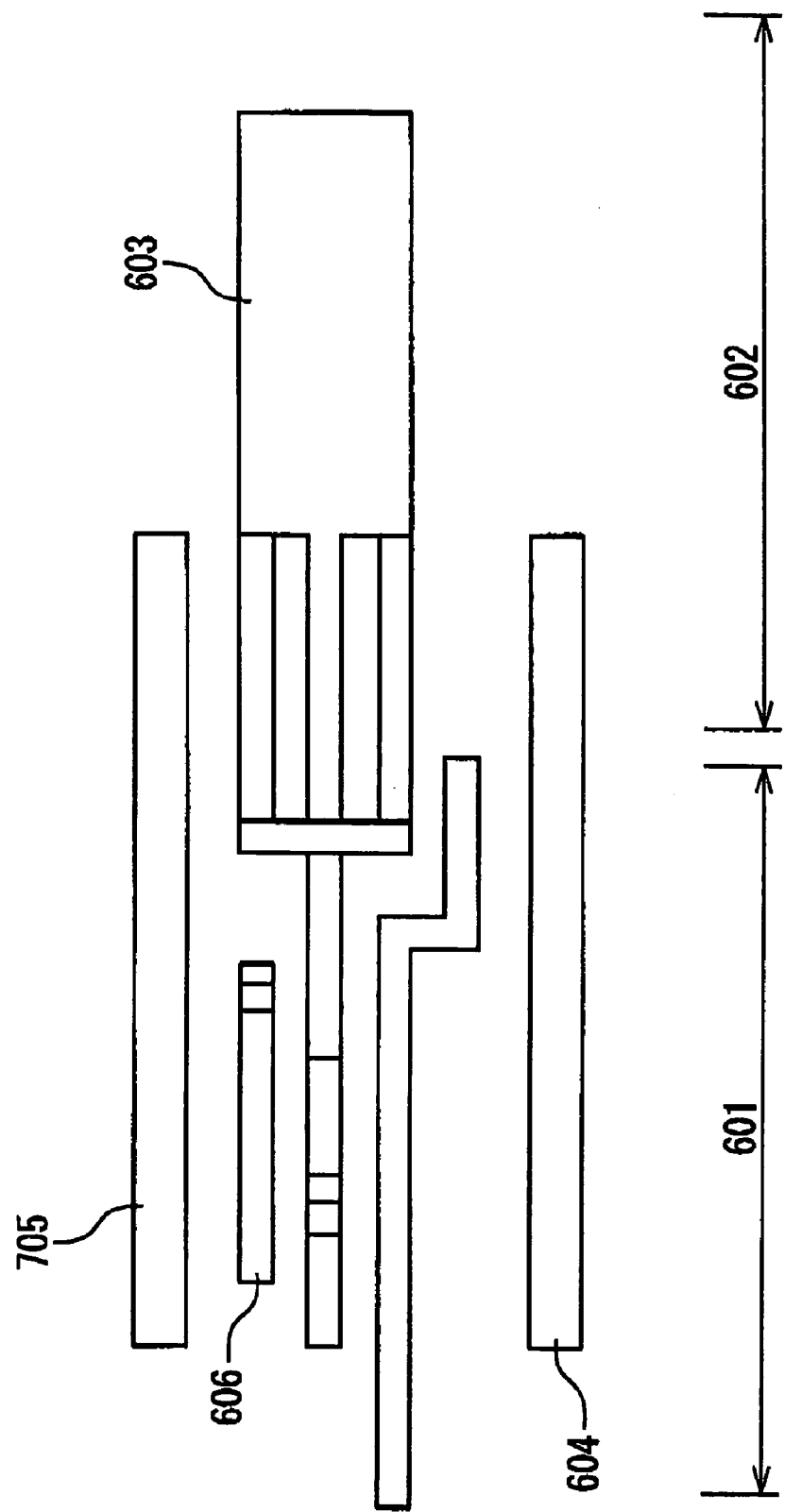
FIG. 16 is a plan view relating to the fifth embodiment.

FIG. 16 shows the plan view of the product according to the fifth embodiment. In FIG. 16, a logic circuit region (macro circuit region) 601 and an outside region 602 outside the macro block are shown. In the logic circuit region 601, there are a power source interconnection array 604 and a GND interconnection array 605. A signal interconnection 606 is arranged between the power source interconnection 604 and the GND interconnection 605. The interconnection 603 for extending the interconnections from the inside of the macro to the outside thereof is also shown in FIG. 16.

Similarly to the TEG for the process evaluation in the first embodiment, this embodiment is characterized in that in the semiconductor device which contains: the macro circuit where the plurality of fine interconnections of 0.1 μm or less are integrated; and the extension wiring which is connected to the predetermined fine interconnection (which is started inside of the macro circuit and is extended toward the outside of the macro circuit in the same interconnection layer) and is wider than those of the fine interconnections, two or more fine interconnections connected to the extension wiring are arranged in parallel in the region in the macro circuit. Specifically, as shown in FIG. 16, three signal interconnections 606 existing in parallel in the logic circuit region 601 are connected to an end of the side of the logic circuit region 601 of the extension wiring 603.

Next, the effect of this embodiment is described.

As described in this embodiment, when the configuration that the two or more fine interconnections linked to the wide extension wiring are arranged in parallel in the region in the macro circuit is applied to a logic product, the effect similar to the first embodiment is achieved. FIG. 17 shows a comparison between the frequencies of the occurrence of defects of the first embodiment and the conventional example.

In the conventional connection method, although there is no problem in extending an interconnection of 0.2 μm, the non-defective product generation probability is low in the extension wiring of 0.1 μm. On the contrary, in the first embodiment, it can be understood that the use of the extension wiring of 0.1 μm suppresses the defect generation rate.

What is claimed is:

1. A semiconductor device, comprising:
a macro circuit comprising fine interconnections;

an extension interconnection which is wider than said fine interconnections and has a first end connected to at least two of said fine interconnections and a second end located at an outside of said macro circuit;

a first fine interconnection of said fine interconnections comprising a width gradually wider toward said first end; and a second fine interconnection and a third fine interconnection which are included in said fine interconnections are respectively formed of both sides of said fine interconnections, wherein a width of said second fine interconnection and a width of said third interconnection are respectively constant in said first end portion.

2. The semiconductor device according to claim 1, wherein said at least two of said fine interconnections are extended from an inside of said macro circuit to said first end and formed in a same layer with said extension interconnection.

3. The semiconductor device according to claim 1, wherein said at least two of said fine interconnections comprise same widths, and the pitches thereof are same.

4. The semiconductor device according to claim 1, wherein a width of each of said at least two of said fine interconnections is equal or less than 0.1 μm.

5. The semiconductor device according to claim 1, wherein said first end is placed inside an envelope of an area in which said macro circuit is formed.

6. The semiconductor device according to claim 1, wherein any of said fine interconnections comprises a normal portion and an isolation portion having larger width than said normal portion, and an adjacent interconnection adjacent to said any of said fine interconnections in said normal portion does not exist at an adjacent place of said isolation portion.

7. The semiconductor device according to claim 1, wherein a width of a plurality of said fine interconnections is gradually wider toward said first end.

* * * * *